United States Patent [19]
Nambu

[11] Patent Number: 5,988,104
[45] Date of Patent: Nov. 23, 1999

[54] PLASMA TREATMENT SYSTEM

[75] Inventor: Hidetaka Nambu, Tokyo, Japan

[73] Assignee: NEC Corporation, Tokyo, Japan

[21] Appl. No.: 08/902,037

[22] Filed: Jul. 29, 1997

[30] Foreign Application Priority Data

Jul. 30, 1996 [JP] Japan .................................. 8-200719

[51] Int. Cl.⁶ ................................................. C23C 16/00
[52] U.S. Cl. ............................ 118/723 MW; 118/723 E; 118/723 ME; 118/723 ER; 156/345
[58] Field of Search ....................... 118/723 E, 723 ER, 118/723 MW, 723 MA, 723 MR, 723 ME, 723 I, 723 IR, 723 AN; 156/345

[56] References Cited

U.S. PATENT DOCUMENTS

| 5,173,641 | 12/1992 | Imahashi et al. | 315/111.41 |
| 5,342,472 | 8/1994 | Imahashi et al. | 156/345 |
| 5,614,025 | 3/1997 | Akimoto | 118/723 MP |
| 5,639,309 | 6/1997 | Akimoto | 118/723 MP |
| 5,685,949 | 11/1997 | Yashima | 156/643.1 |
| 5,698,036 | 12/1997 | Ishii et al. | 118/723 MW |
| 5,858,162 | 1/1999 | Kubota | 156/345 |

FOREIGN PATENT DOCUMENTS

| 0 264 913 | 4/1988 | European Pat. Off. . |
| 0 382 065 | 8/1990 | European Pat. Off. . |
| 0 477 906 | 4/1992 | European Pat. Off. . |
| 1-283359 | 11/1989 | Japan . |
| 4-361529 | 12/1992 | Japan . |
| 6-163483 | 6/1994 | Japan . |
| 7-335567 | 12/1995 | Japan . |
| 8-96990 | 4/1996 | Japan . |

OTHER PUBLICATIONS

H. Mabuchi et al., "Surface–Wave–Coupled–Plasma for Anisotropic Etching", pp. 235–240, 1994 Dry Process Symposium.

Takeshi Akimoto et al., "Oxide Etching Using Surface Wave Coupled Plasma", pp. 7037–7041, Jpn. J. Appl. Phys. vol. 33, Part 1, No. 12B, Dec. 1994.

*Primary Examiner*—Bruce Breneman
*Assistant Examiner*—Luz Alejandro
*Attorney, Agent, or Firm*—Young & Thompson

[57] ABSTRACT

The present invention provides a plasma treatment system having a reaction chamber in which a plasma is generated to be irradiated onto a sample held on a sample holder in the reaction chamber. The reaction chamber has a top covered by a dielectric plate. The plasma treatment system also has an opposite electrode having a plurality of windows through which microwave is transmitted into the reaction chamber for causing the plasma, wherein the opposite electrode is provided over a top surface of the dielectric plate so that the opposite electrode is separated by the dielectric plate from the plasma generated in the reaction chamber.

16 Claims, 5 Drawing Sheets

PLASMA TREATMENT SYSTEM

BACKGROUND OF THE INVENTION

The present invention provides a plasma treatment system, and more particularly to a plasma treatment system for etching a semiconductor substrate and for plasma-treating a semiconductor thin film in manufacturing processes for electric devices and semiconductor devices.

The plasma treating system has a vacuum reaction chamber kept in a low gas pressure. A microwave is introduced into the reaction chamber to cause a gas discharge for causing a plasma which is to be irradiated onto a sample "S" such as a semiconductor substrate for etching the semiconductor substrate and for growing a semiconductor thin film. For drying etching technique and growth of a semiconductor thin film, it is required to control both the microwave for generation of the plasma and a power for acceleration of ions in plasma generated independently.

FIG. 1 is a cross sectional elevation view illustrative of a conventional plasma treatment system which is capable of controlling the generation of plasma and acceleration of ions in the plasma independently. The conventional plasma treatment system has a reaction chamber 1 which is rectangular-shaped and made of a metal such as aluminum and stainless steel. In the reaction chamber 1, a sample stage 8 is provided which has a sample holder 7 which holds a sample to be treated with plasma. A high frequency power 9 is provided which is electrically connected to the sample holder 7 for applying a high frequency voltage to the sample S. The sample stage 8 is provided on a bottom wall of the reaction chamber 1. Side walls of the reaction chamber 1 are formed thickly so that electrical heaters 15 are provided within the side walls of the reaction chamber 1. The heaters 15 are electrically connected to a heater power 19 for supplying a power to the heaters 15 so that the heaters 15 heat up inner space of the reaction chamber 1. Sheet type rubber heaters 16 is also provided on the bottom of the opposite end portions of the opposite electrode 11 for heating up the opposite electrode 11 for preventing deposition from adhesion on the opposite electrode 11. The sheet type rubber heater 16 is also connected to the heater power supply 19. A gas supply tube 13 is provided on a side wall of the reaction chamber 1 for supplying a reaction gas into the reaction chamber 1 so that the microwave is irradiated onto the a reaction gas introduced to cause a plasma. A discharge tube 12 is also provided on the side wall of the reaction chamber 1 for discharging the used gas from the reaction chamber 1. A dielectric film is provided on the top of the reaction chamber 1 which is made of a microwave-permissible dielectric such as quartz glass or $Al_2O_3$ having a small dielectric loss and a high heat resistivity. The sample holder 7 serves as a cathode to be supplied with the high frequency power from the high frequency power supply 9. On the bottom surface of the dielectric film 2, an opposite electrode 11 serving as an anode and being made of aluminum is provided which has a plurality of windows through which microwaves are transmitted into the reaction chamber 1. The opposite electrode is also contacted with the side wall of the reaction chamber 1 and the side wall of the reaction chamber 1 is grounded by a ground line 10 so as to allow a strain free electric field to be generated between the electrodes and allow a uniform bias voltage on the sample S. A dielectric line 3 is provided which extends to cover the dielectric film 2 and to be spaced apart from the dielectric film 2. The dielectric line 3 comprises a dielectric layer made of a dielectric having a small dielectric loss such as fluorine resin. A metal plate 4 made of a metal such as aluminum is provided which laminates on the top of the dielectric line 3. The metal plate 4 extends not only over the top surface of the dielectric line 3 but also on the end of the dielectric line 3 for sealing the end of the dielectric line 3. A waveguide 6 is provided which is connected with the dielectric line 3 for guiding the transmission or propagation of the microwave. A microwave oscillator 5 is provided which is connected to the waveguide 6 for generating the microwave which is to be transmitted or propagated through the waveguide 6 and the dielectric line 3 and also through the microwave-permissible dielectric plate 2 and the windows 14 into the inner space of the reaction chamber 1 so that the microwave is irradiated onto the reaction gas introduced to cause the plasma which is to be irradiated onto the sample for plasma treatment.

The above plasma treatment system is operated as follows. The used gas us discharged through the discharge tube 12 to reduce the pressure of the gas in the reaction chamber 1 at a predetermined value. Thereafter, the fresh reaction gas is introduced through the gas supply tube 13 into the reaction chamber 1. A microwave is generated by the microwave generator 5. The generated microwave is then introduced through the waveguide 6 into the dielectric line 3 whereby an electric field is generated in the space positioned under the dielectric line 3. The generated electric field is transmitted through the microwave-permissible dielectric plate 2 and the windows 14 of the opposite electrode 11 into the inner space of the reaction chamber 1. Since the reaction gas has been introduced into the inner space, the electric field or the microwave is applied to the reaction gas whereby a plasma is caused. On the other hand, the high frequency voltage is applied to the sample holder 7 holding the sample S for causing a bias voltage on the surface of the sample S so that the bias voltage controls energy of ions in the plasma generated. The bias voltage causes the ions of the plasma to be irradiated onto the top surface of the sample S in the right angle to the top surface of the sample S for plasma treatment of the sample S.

FIG. 2 is a plane view illustrative of the opposite electrode 11 having stripe shaped windows 14. The sheet type rubber heater 16 is provided on the peripheral portion of the opposite electrode 11. The opposite electrode 11 made of aluminum is exposed to the plasma generated in the inner space of the reaction chamber 1. The opposite electrode is made of an aluminum-based material and is coated with alumite. The exposure of the opposite electrode made of the aluminum-based material causes a clack on the alumite coating layer on the opposite electrode whereby aluminum of the opposite electrode reacts with fluorine in the reaction gas to form $AlF_3$ which is dust particles.

As examination, 25 dummy wafers have been treated under conditions of $CF_4/CH_2F_2=40/40$ sccm,$\mu$/RF=1300/600 W and 2 minutes of exposure of the plasma. Immediately thereafter, the dummy wafers are carried in the reaction chamber 1 during which the reaction gas is blown under the condition of $CF_4/CH_2F_2=40/40$ sccm without generation of plasma. About 20000 dust particles of 0.4 micrometers in diameter have been observed on the wafer of 8 inches in diameter. The dust particles were analyzed by an X-ray photo-electro spectroscopic analyzer to determine the dust particles to be $AlF_3$. It was confirmed that the provision of the opposite electrode 11 made of aluminum-based material in the reaction chamber 1 to expose the opposite electrode 11 to the plasma results in generation of many dust particles of $AlF_3$.

The dielectric plate 2 is made of the quartz or $Al_2O_3$ and has a thickness of 2 cm. Since quartz glass and $Al_2O_3$ have large heat capacities, the temperature of the dielectric plate 2 is increased up to the saturation temperature by the plasma treatment carried out in the reaction chamber 1. The increase in temperature of the dielectric plate 2 causes the deposition to release or discharge from the dielectric plate 2. This provides a great deal of influence to the etching properties, for example, the etching rate and selective ratio of etching are changed.

As examination, 7 dummy wafers of polysilicon have been treated under conditions of $CF_4/CH_2F_2$=40/40 sccm, $\mu$/RF=1300/600 W and 2 minutes of exposure of the plasma during which variations in etching rate of the polysilicon wafer and temperature of the center portion of the dielectric plate for every wafers have been obverted. The heat resistive dielectric plate 2 has been preheated by the heater 15 provided in the reaction chamber 1 and also by the sheet-type rubber heater 16 provided on the peripheral portion of the opposite electrode 6, wherein the heaters 15 and 16 have been set at a temperature of 170° C. Notwithstanding, the center portion of the dielectric film 2 has a temperature of 143° C. This means it difficult to realize a uniform heating up of the dielectric plate 2 by use of the rubber heater 16. The measured variations in etching rate of the individual polysilicon wafers and in temperature of the individual dielectric films are shown in Table 1.

TABLE 1

| Number of wafers | 0 | 1 | 2 | 3 | 4 | 5 | 6 | 7 |
|---|---|---|---|---|---|---|---|---|
| Temperature (° C.) | 143 | 158 | 163 | 165 | 174 | 176 | 178 | 177 |
| Etching-Rate (A/min) | 542 | 438 | 396 | 390 | 386 | 386 | 389 | 385 |

In the above circumstances, it had been required to provide a plasma treatment system for treating a semiconductor wafer or a semiconductor thin film with a plasma, which is capable of preventing generation of dust particles and of keeping a dielectric film provided in the system at a constant temperature without variation in temperature of a center portion of the dielectric film.

SUMMARY OF THE INVENTION

Accordingly, it is a first object of the present invention to provide a novel plasma treatment system for treating a semiconductor wafer or a semiconductor thin film, which is capable of preventing generation of dust particles.

It is a second object of the present invention to provide a novel plasma treatment system for treating a semiconductor wafer or a semiconductor thin film, which is capable of keeping a dielectric film provided in the system at a constant temperature without variation in temperature of a center portion of the dielectric film.

It is a third object of the present invention to provide an improved opposite electrode structure provided in a plasma treatment system for treating a semiconductor wafer or a semiconductor thin film, which is capable of preventing generation of dust particles.

It is a second object of the present invention to provide an improved opposite electrode structure provided in a plasma treatment system for treating a semiconductor wafer or a semiconductor thin film, which is capable of keeping a dielectric film provided in the system at a constant temperature without variation in temperature of a center portion of the dielectric film.

The above and other objects, features and advantages of the present invention will be apparent from the following descriptions.

The present invention provides an opposite electrode structure provided in a plasma treatment system having a reaction chamber in which a plasma is generated to be irradiated onto a sample held on a sample holder in the reaction chamber. The reaction chamber has a top covered by a dielectric plate. The opposite electrode structure comprises an opposite electrode having a plurality of windows through which microwave is transmitted into the reaction chamber for causing the plasma, wherein the opposite electrode is provided over a top surface of the dielectric plate so that the opposite electrode is separated by the dielectric plate from the plasma generated in the reaction chamber.

The present invention provides a plasma treatment system having a reaction chamber in which a plasma is generated to be irradiated onto a sample held on a sample holder in the reaction chamber. The reaction chamber has a top covered by a dielectric plate. The plasma treatment system also has an opposite electrode having a plurality of windows through which microwave is transmitted into the reaction chamber for causing the plasma, wherein the opposite electrode is provided over a top surface of the dielectric plate so that the opposite electrode is separated by the dielectric plate from the plasma generated in the reaction chamber.

DISCLOSURE OF THE INVENTION

Figure 1:
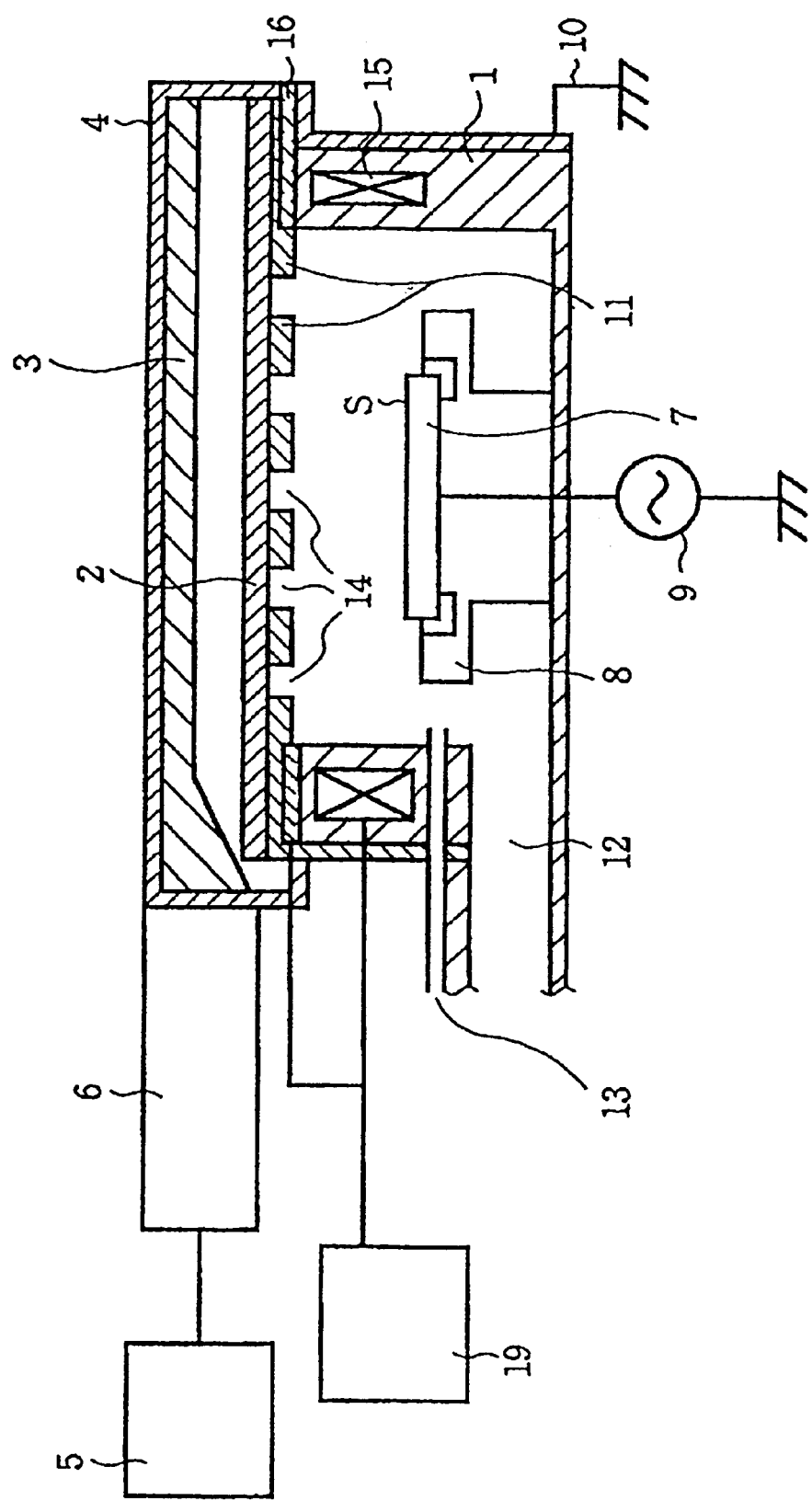
FIG. 1 is a cross sectional elevation view illustrative of a conventional plasma treatment system which is capable of controlling the generation of plasma and acceleration of ions in the plasma independently.
Figure 2:
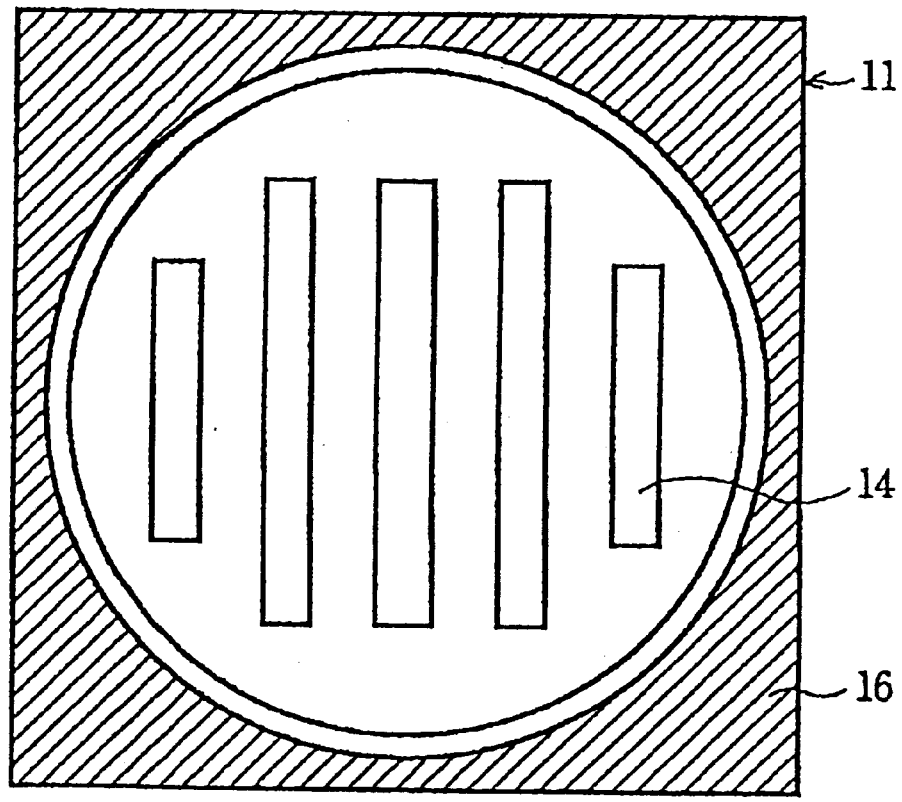
FIG. 2 is a plane view illustrative of the opposite electrode 11 having stripe shaped windows 14.

The present invention provides an opposite electrode structure provided in a plasma treatment system having a reaction chamber in which a plasma is generated to be irradiated onto a sample held on a sample holder in the reaction chamber. The reaction chamber has a top covered by a dielectric plate. The opposite electrode structure comprises an opposite electrode having a plurality of windows through which microwave is transmitted into the reaction chamber for causing the plasma, wherein the opposite electrode is provided over a top surface of the dielectric plate so that the opposite electrode is separated by the dielectric plate from the plasma generated in the reaction chamber.

It is preferable to further provide at least an internal heater within the opposite electrode.

It is preferable that the internal heater is provided to be entirely distributed over the opposite electrode.

It is preferable to further provide at least an internal heater within a center region of the opposite electrode and a peripheral heater provided on a peripheral region of the opposite electrode.

It is preferable to further provide an air-type temperature controller over the dielectric plate for blowing a temperature-controlled air to the opposite electrode and the top surface of the dielectric plate for controlling a temperature of the dielectric plate.

It is preferable to further provide a liquid-type temperature controller over the dielectric plate and under the opposite electrode for flowing a temperature-controlled liquid in the liquid-type temperature controller for controlling a temperature of the dielectric plate.

It is preferable to further provide an air-type temperature controller over the dielectric plate for blowing a temperature-controlled air to the opposite electrode and the top surface of the dielectric plate for controlling a temperature of the dielectric plate, and at least an internal heater within the opposite electrode.

It is preferable to further provide a liquid-type temperature controller over the dielectric plate and under the opposite electrode for flowing a temperature-controlled liquid in the liquid-type temperature controller for controlling a temperature of the dielectric plate, and at least an internal heater within the opposite electrode.

The present invention provides a plasma treatment system having a reaction chamber in which a plasma is generated to be irradiated onto a sample held on a sample holder in the reaction chamber. The reaction chamber has a top covered by a dielectric plate. The plasma treatment system also has an opposite electrode having a plurality of windows through which microwave is transmitted into the reaction chamber for causing the plasma, wherein the opposite electrode is provided over a top surface of the dielectric plate so that the opposite electrode is separated by the dielectric plate from the plasma generated in the reaction chamber.

It is preferable to further provide at least an internal heater within the opposite electrode.

It is preferable that the internal heater is provided to be entirely distributed over the opposite electrode.

It is preferable to further provide at least an internal heater within a center region of the opposite electrode and a peripheral heater provided on a peripheral region of the opposite electrode.

It is preferable to further provide an air-type temperature controller over the dielectric plate for blowing a temperature-controlled air to the opposite electrode and the top surface of the dielectric plate for controlling a temperature of the dielectric plate.

It is preferable to further provide a liquid-type temperature controller over the dielectric plate and under the opposite electrode for flowing a temperature-controlled liquid in the liquid-type temperature controller for controlling a temperature of the dielectric plate.

It is preferable to further provide an air-type temperature controller over the dielectric plate for blowing a temperature-controlled air to the opposite electrode and the top surface of the dielectric plate for controlling a temperature of the dielectric plate, and at least an internal heater within the opposite electrode.

It is preferable to further provide a liquid-type temperature controller over the dielectric plate and under the opposite electrode for flowing a temperature-controlled liquid in the liquid-type temperature controller for controlling a temperature of the dielectric plate, and at least an internal heater within the opposite electrode.

PREFERRED EMBODIMENTS

Figure 3:
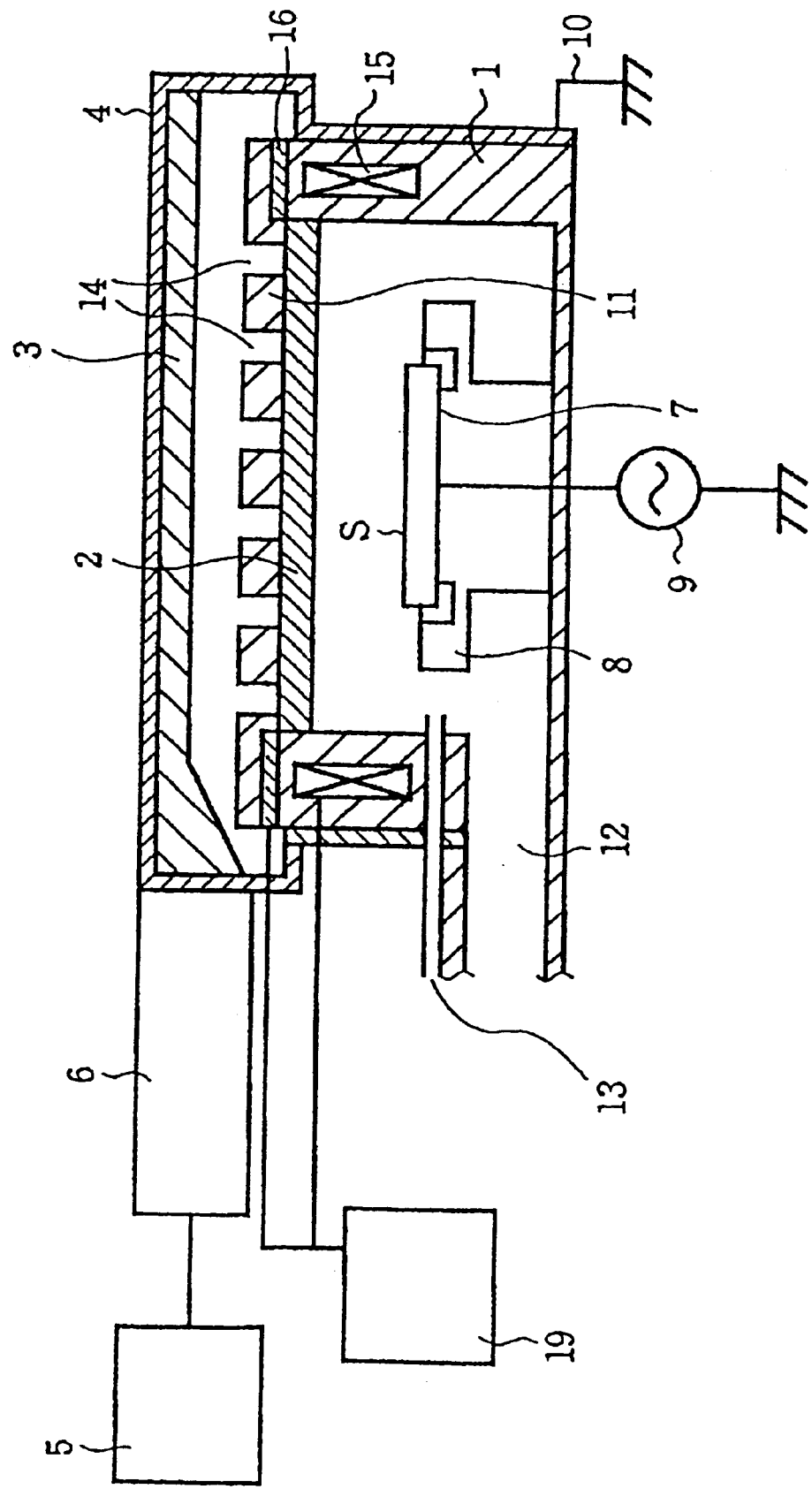
FIG. 3 which is a cross sectional elevation view illustrative of a novel plasma treatment system which is capable of preventing generation of dust particles and of keeping a dielectric film provided in the system at a constant temperature without variation in temperature of a center portion of the dielectric film in a first, third and fourth embodiments in accordance with the present invention.

First Embodiment:

A first embodiment according to the present invention will be described in detail with reference to FIG. 3 which is a cross sectional elevation view illustrative of a novel plasma treatment system which is capable of preventing generation of dust particles and of keeping a dielectric film provided in the system at a constant temperature without variation in temperature of a center portion of the dielectric film.

The novel plasma treatment system has a reaction chamber 1 which is rectangular-shaped and made of a metal such as aluminum and stainless steel. In the reaction chamber 1, a sample stage 8 is provided which has a sample holder 7 which holds a sample to be treated with plasma. A high frequency power 9 is provided which is electrically connected to the sample holder 7 for applying a high frequency voltage to the sample S. The sample stage 8 is provided on a bottom wall of the reaction chamber 1. Side walls of the reaction chamber 1 are formed thickly so that electrical heaters 15 are provided within the side walls of the reaction chamber 1. The heaters 15 are electrically connected to a heater power 19 for supplying a power to the heaters 15 so that the heaters 15 heat up inner space of the reaction chamber 1. A gas supply tube 13 is provided on a side wall of the reaction chamber 1 for supplying a reaction gas into the reaction chamber 1 so that the microwave is irradiated onto the a reaction gas introduced to cause a plasma. A discharge tube 12 is also provided on the side wall of the reaction chamber 1 for discharging the used gas from the reaction chamber 1. A dielectric film is provided on the top of the reaction chamber 1 which is made of a microwave-permissible dielectric such as quartz glass or $Al_2O_3$ having a small dielectric loss and a high heat resistivity. The sample holder 7 serves as a cathode to be supplied with the high frequency power from the high frequency power supply 9.

On the top surface of the dielectric film 2, an opposite electrode 11 serving as an anode and being made of aluminum-based material is provided which has a plurality of windows 14 through which microwaves are transmitted into the reaction chamber 1. The opposite electrode 11 is thus provided outside the reaction chamber to be separated from the plasma. The opposite electrode is made of an aluminum-based material and is coated with alumite. The opposite electrode 11 is also contacted with the side wall of the reaction chamber 1 and the side wall of the reaction chamber 1 is grounded by a ground line 10 so as to allow a strain free electric field to be generated between the electrodes and allow a uniform bias voltage on the sample S. A sheet type rubber heater 16 is also provided on the bottom of the opposite end portions of the opposite electrode 11 for heating up the opposite electrode 11 for preventing deposition from adhesion on the opposite electrode 11. The sheet type rubber heater 16 is also connected to the heater power supply 19. A dielectric line 3 is provided which extends to cover the dielectric film 2 and to be spaced apart from the dielectric film 2. The dielectric line 3 comprises a dielectric layer made of a dielectric having a small dielectric loss such as fluorine resin. A metal plate 4 made of a metal such as aluminum is provided which laminates on the top of the dielectric line 3. The metal plate 4 extends not only over the top surface of the dielectric line 3 but also on the end of the dielectric line 3 for sealing the end of the dielectric line 3. A waveguide 6 is provided which is connected with the dielectric line 3 for guiding the transmission or propagation of the microwave. A microwave oscillator 5 is provided which is connected to the waveguide 6 for generating the microwave which is to be transmitted or propagated through the waveguide 6 and the dielectric line 3 and also through the microwave-permissible dielectric plate 2 and the windows 14 into the inner space of the reaction chamber 1 so that the microwave is irradiated onto the reaction gas introduced to cause the plasma which is to be irradiated onto the sample for plasma treatment.

The above plasma treatment system is operated as follows. The used gas us discharged through the discharge tube 12 to reduce the pressure of the gas in the reaction chamber 1 at a predetermined value. Thereafter, the fresh reaction gas is introduced through the gas supply tube 13 into the reaction chamber 1. A microwave is generated by the microwave generator 5. The generated microwave is then introduced through the waveguide 6 into the dielectric line 3 whereby an electric field is generated in the space positioned under the dielectric line 3. The generated electric field is transmitted through the microwave-permissible dielectric plate 2 and the windows 14 of the opposite electrode 11 into the inner space of the reaction chamber 1. Since the reaction gas has been introduced into the inner space, the electric field or the microwave is applied to the reaction gas whereby a plasma is caused. On the other hand, the high frequency voltage is applied to the sample holder 7 holding the sample S for causing a bias voltage on the surface of the sample S so that the bias voltage controls energy of ions in the plasma generated. The bias voltage causes the ions of the plasma to be irradiated onto the top surface of the sample S in the right angle to the top surface of the sample S for plasma treatment of the sample S.

Since the opposite electrode is separated by the dielectric film 2 from the inner space of the reaction chamber 1, the opposite electrode 11 made of aluminum-based material is not exposed to the plasma generated in the inner space of the reaction chamber 1. No exposure of the opposite electrode made of the aluminum-based material causes no clack on the alumite coating layer on the opposite electrode whereby no reaction of aluminum of the opposite electrode with fluorine in the reaction gas is caused to form no dust particles $AlF_3$.

As examination, 25 dummy wafers have been treated under conditions of $CF_4/CH_2F_2$=40/40 sccm,$\mu$/RF=1300/ 600 W and 2 minutes of exposure of the plasma. Immediately thereafter, the dummy wafers are carried in the reaction chamber 1 during which the reaction gas is blown under the condition of $CF_4/CH_2F_2$=40/40 sccm without generation of plasma. About 20 dust particles of 0.4 micrometers in diameter have been observed on the wafer of 8 inches in diameter. The dust particles were analyzed by an X-ray photo-electro spectroscopic analyzer to determine the dust particles to be $AlF_3$. It was confirmed that the provision of the opposite electrode 11 made of aluminum-based material outside the reaction chamber 1 to expose the opposite electrode 11 to the plasma results in generation of only 20 dust particles of fluorocarbon with no generation $AlF_3$ The provision of the opposite electrode 11 made of aluminum-based material outside the reaction chamber 1 to separate the opposite electrode 11 from the plasma suppresses generation of dust particles.

Figure 4:
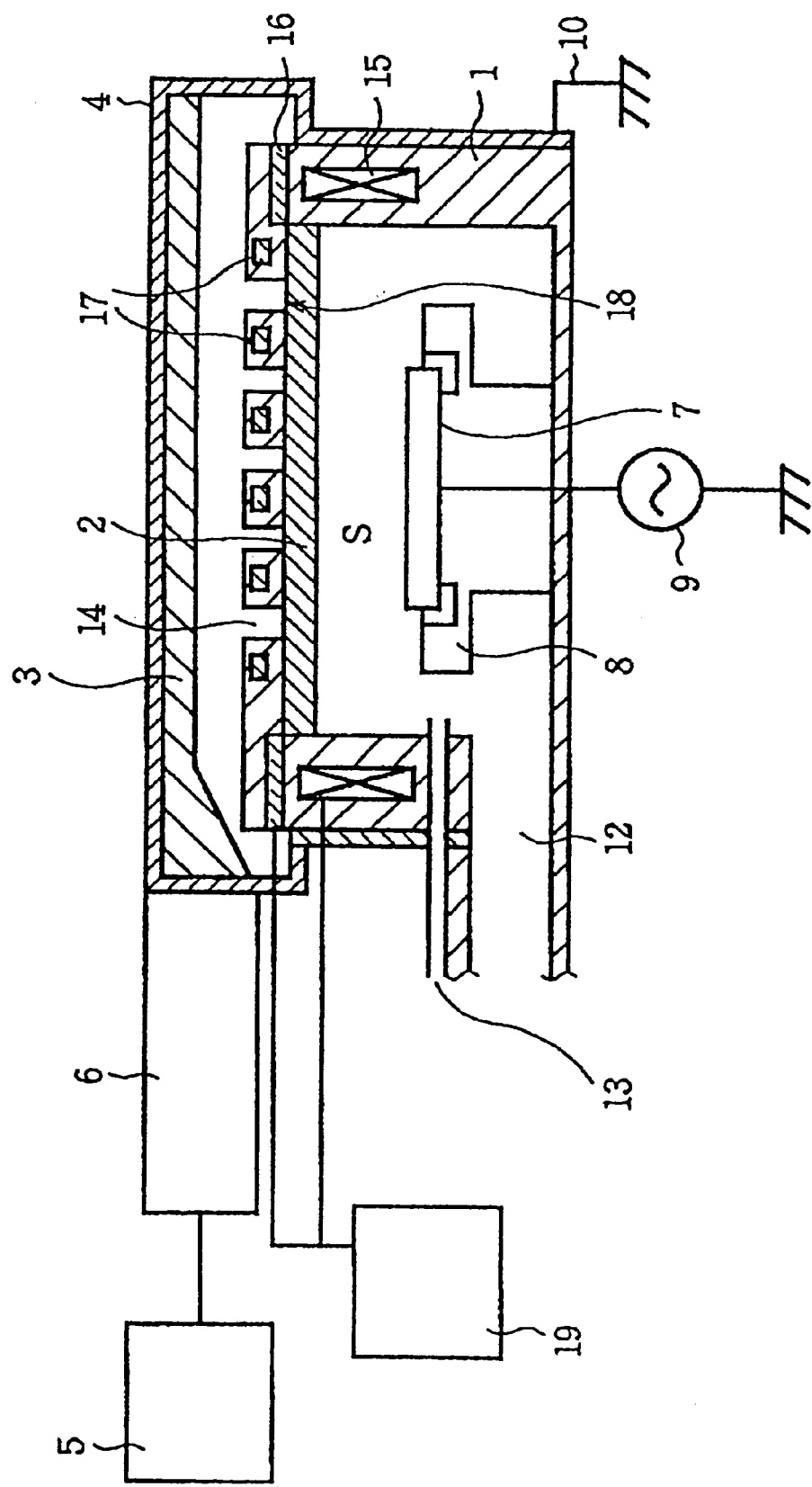
FIG. 4 which is a cross sectional elevation view illustrative of a novel plasma treatment system which is capable of preventing generation of dust particles and of keeping a dielectric film provided in the system at a constant temperature without variation in temperature of a center portion of the dielectric film in a second, fifth and sixth embodiments in accordance with the present invention.

Second Embodiment:

A second embodiment according to the present invention will be described in detail with reference to FIG. 4 which is a cross sectional elevation view illustrative of a novel plasma treatment system which is capable of preventing generation of dust particles and of keeping a dielectric film provided in the system at a constant temperature without variation in temperature of a center portion of the dielectric film.

The novel plasma treatment system has a reaction chamber 1 which is rectangular-shaped and made of a metal such as aluminum and stainless steel. In the reaction chamber 1, a sample stage 8 is provided which has a sample holder 7 which holds a sample to be treated with plasma. A high frequency power 9 is provided which is electrically connected to the sample holder 7 for applying a high frequency voltage to the sample S. The sample stage 8 is provided on a bottom wall of the reaction chamber 1. Side walls of the reaction chamber 1 are formed thickly so that electrical heaters 15 are provided within the side walls of the reaction chamber 1. The heaters 15 are electrically connected to a heater power 19 for supplying a power to the heaters 15 so that the heaters 15 heat up inner space of the reaction chamber 1. A gas supply tube 13 is provided on a side wall of the reaction chamber 1 for supplying a reaction gas into the reaction chamber 1 so that the microwave is irradiated onto the a reaction gas introduced to cause a plasma. A discharge tube 12 is also provided on the side wall of the reaction chamber 1 for discharging the used gas from the reaction chamber 1. A dielectric film is provided on the top of the reaction chamber 1 which is made of a microwave-permissible dielectric such as quartz glass or $Al_2O_3$ having a small dielectric loss and a high heat resistivity. The sample holder 7 serves as a cathode to be supplied with the high frequency power from the high frequency power supply 9.

Figure 5A:
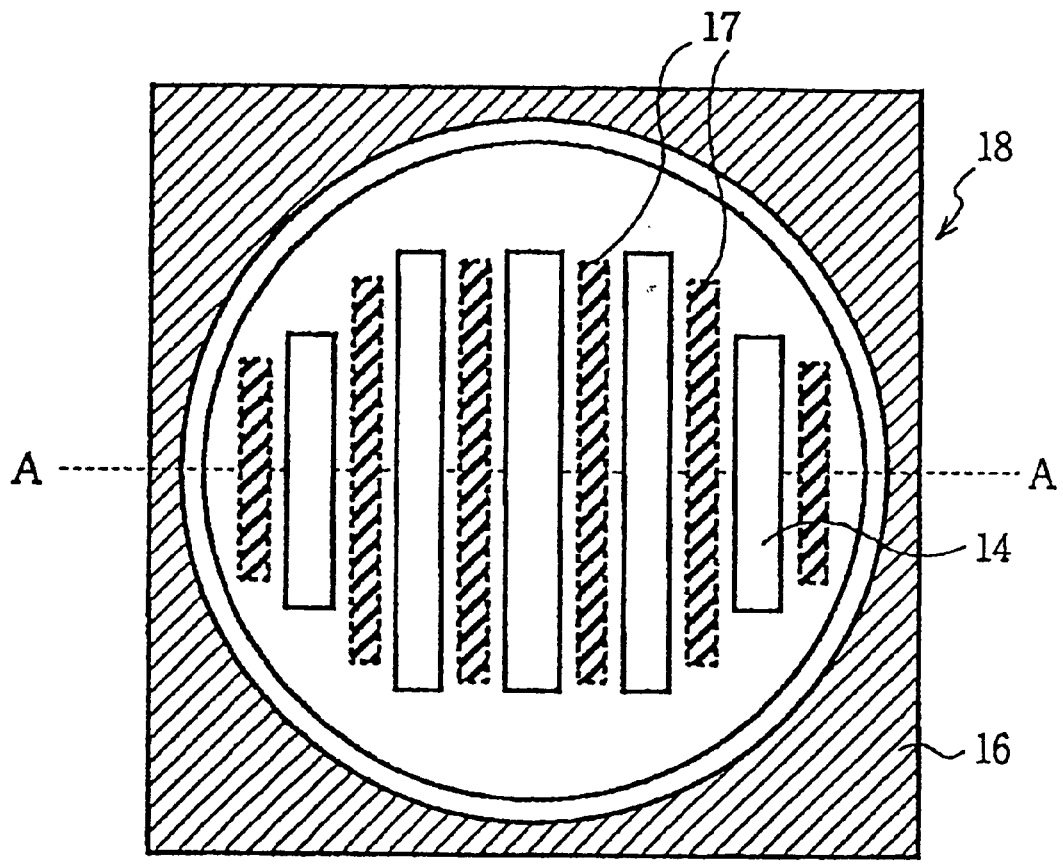
FIG. 5A is a plane view illustrative of an opposite electrode having windows and additional heaters provided in the plasma treatment system of FIG. 4.
Figure 5B:
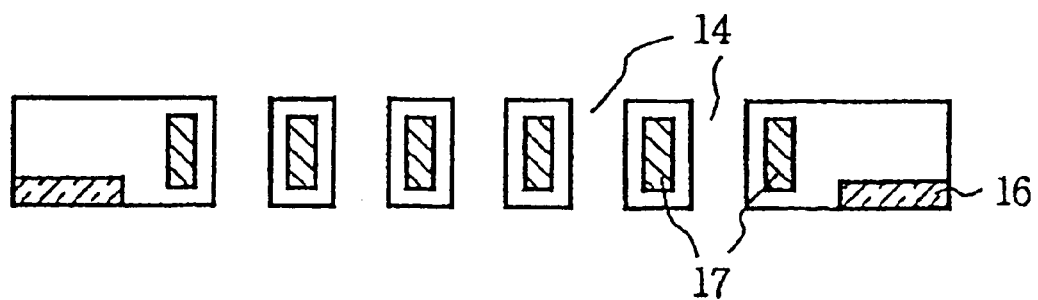
FIG. 5B is a fragmentary cross sectional elevation view illustrative of an opposite electrode having windows and additional heaters provided in the plasma treatment system of FIG. 4.

On the top surface of the dielectric film 2, an opposite electrode 18 serving as an anode and being made of aluminum-based material is provided which has a plurality of windows 14 through which microwaves are transmitted into the reaction chamber 1. FIG. 5A is a plane view illustrative of an opposite electrode 18 having windows 14 and additional heaters 17 provided in the plasma treatment system. FIG. 5B is a fragmentary cross sectional elevation view illustrative of an opposite electrode 18 having windows 14 and additional heaters 17 provided in the plasma treatment system. The opposite electrode 18 is thus provided outside the reaction chamber to be separated from the plasma. The opposite electrode 18 is made of an aluminum-based material and is coated with alumite. The opposite electrode 18 is also contacted with the side wall of the reaction chamber 1 and the side wall of the reaction chamber 1 is grounded by a ground line 10 so as to allow a strain free electric field to be generated between the electrodes and allow a uniform bias voltage on the sample S. A sheet type rubber heater 16 is also provided on the bottom of the opposite end portions of the opposite electrode 18 for heating up the opposite electrode 18 for preventing deposition from adhesion on the opposite electrode 18. The sheet type rubber heater 16 is also connected to the heater power supply 19. A dielectric line 3 is provided which extends to cover the dielectric film 2 and to be spaced apart from the dielectric film 2. The dielectric line 3 comprises a dielectric layer made of a dielectric having a small dielectric loss such as fluorine resin. The additional heaters 17 are stripe-shaped and extend within the opposite electrode 11 in parallel to the stripe-shaped windows 14. Since the additional heaters 17 are distributed entirely over the center portion of the opposite electrode 18 and the sheet type rubber heater 16 extends on the peripheral portion of the opposite electrode 18 so that the dielectric plate 2 underlying the opposite electrode 18 is almost uniformly heated whereby no remarkable variation in temperature appears in the dielectric film 2. A metal plate 4 made of a metal such as aluminum is provided which laminates on the top of the dielectric line 3. The metal plate 4 extends not only over the top surface of the dielectric line 3 but also on the end of the dielectric line 3 for sealing the end of the dielectric line 3. A waveguide 6 is provided which is connected with the dielectric line 3 for guiding the transmission or propagation of the microwave. A microwave oscillator 5 is provided which is connected to the waveguide 6 for generating the microwave which is to be transmitted or propagated through the waveguide 6 and the dielectric line 3 and also through the microwave-permissible dielectric plate 2 and the windows 14 into the inner space of the reaction chamber 1 so that the microwave is irradiated onto the reaction gas introduced to cause the plasma which is to be irradiated onto the sample for plasma treatment.

The above plasma treatment system is operated as follows. The used gas us discharged through the discharge tube 12 to reduce the pressure of the gas in the reaction chamber 1 at a predetermined value. Thereafter, the fresh reaction gas is introduced through the gas supply tube 13 into the reaction chamber 1. A microwave is generated by the microwave generator 5. The generated microwave is then introduced through the waveguide 6 into the dielectric line 3 whereby an electric field is generated in the space positioned under the dielectric line 3. The generated electric field is transmitted through the microwave-permissible dielectric plate 2 and the windows 14 of the opposite electrode 18 into the inner space of the reaction chamber 1. Since the reaction gas has been introduced into the inner space, the electric field or the microwave is applied to the reaction gas whereby a plasma is caused. On the other hand, the high frequency voltage is applied to the sample holder 7 holding the sample S for causing a bias voltage on the surface of the sample S so that the bias voltage controls energy of ions in the plasma generated. The bias voltage causes the ions of the plasma to be irradiated onto the top surface of the sample S in the right angle to the top surface of the sample S for plasma treatment of the sample S.

Since the opposite electrode 18 is separated by the dielectric film 2 from the inner space of the reaction chamber 1, the opposite electrode 11 made of aluminum-based material is not exposed to the plasma generated in the inner space of the reaction chamber 1. No exposure of the opposite electrode made of the aluminum-based material causes no clack on the alumite coating layer on the opposite electrode whereby no reaction of aluminum of the opposite electrode with fluorine in the reaction gas is caused to form no dust particles $AlF_3$.

As examination, 25 dummy wafers have been treated under conditions of $CF_4/CH_2F_2$=40/40 sccm,$\mu$/RF=1300/600 W and 2 minutes of exposure of the plasma. Immediately thereafter, the dummy wafers are carried in the reaction chamber 1 during which the reaction gas is blown under the condition of $CF_4/CH_2F_2$=40/40 sccm without generation of plasma. About 20 dust particles of 0.4 micrometers in diameter have been observed on the wafer of 8 inches in diameter. The dust particles were analyzed by an X-ray photo-electro spectroscopic analyzer to determine the dust particles to be $AlF_3$. It was confirmed that the provision of the opposite electrode 18 made of aluminum-based material outside the reaction chamber 1 to expose the opposite electrode 18 to the plasma results in generation of only 20 dust particles of fluorocarbon with no generation $AlF_3$. The provision of the opposite electrode 18 made of aluminum-based material outside the reaction chamber 1 to separate the opposite electrode 18 from the plasma suppresses generation of dust particles.

Further, the additional heaters 17 are distributed entirely over the center portion of the opposite electrode 18 and the sheet type rubber heater 16 extends on the peripheral portion of the opposite electrode 18 so that the dielectric plate 2 underlying the opposite electrode 18 is almost uniformly heated whereby no remarkable variation in temperature appears in the dielectric film 2.

As examination, 7 dummy wafers of polysilicon have been treated under conditions of $CF_4/CH_2F_2$=40/40 sccm, $\mu$/RF=1300/600 W and 2 minutes of exposure of the plasma during which variations in etching rate of the polysilicon wafer and temperature of the center portion of the dielectric plate for every wafers have been obverted. The heat resistive dielectric plate 2 has been preheated by the heater 15 provided in the reaction chamber 1 and also by the sheet-type rubber heater 16 provided on the peripheral portion of the opposite electrode 6, wherein the additional heaters 17 have been set at a temperature of 170° C. The dielectric plate 18 is heated by the additional heaters 17, the heater 15 and the sheet-type rubber heater 16. As a result, the center portion of the dielectric film 2 has a temperature of 168° C. This means it possible to realize the desired uniform heating up of the dielectric plate 2 by use of the additional heaters 17. The measured variations in etching rate of the individual polysilicon wafers and in temperature of the individual dielectric films are shown in Table 2. Almost no variations in temperature and etching rate are measured.

TABLE 2

| Number of wafers | 0 | 1 | 2 | 3 | 4 | 5 | 6 | 7 |
|---|---|---|---|---|---|---|---|---|
| Temperature (° C.) | 168 | 177 | 178 | 179 | 178 | 179 | 177 | 177 |
| Etching-Rate (A/min) | 390 | 385 | 387 | 386 | 387 | 386 | 387 | 388 |

Third Embodiment:

A third embodiment according to the present invention will be described in detail with reference to FIG. 3 which is a cross sectional elevation view illustrative of a novel plasma treatment system which is capable of preventing generation of dust particles and of keeping a dielectric film provided in the system at a constant temperature without variation in temperature of a center portion of the dielectric film.

The novel plasma treatment system has a reaction chamber 1 which is rectangular-shaped and made of a metal such as aluminum and stainless steel. In the reaction chamber 1, a sample stage 8 is provided which has a sample holder 7 which holds a sample to be treated with plasma. A high frequency power 9 is provided which is electrically connected to the sample holder 7 for applying a high frequency voltage to the sample S. The sample stage 8 is provided on a bottom wall of the reaction chamber 1. Side walls of the reaction chamber 1 are formed thickly so that electrical heaters 15 are provided within the side walls of the reaction chamber 1. The heaters 15 are electrically connected to a heater power 19 for supplying a power to the heaters 15 so that the heaters 15 heat up inner space of the reaction chamber 1. A gas supply tube 13 is provided on a side wall of the reaction chamber 1 for supplying a reaction gas into the reaction chamber 1 so that the microwave is irradiated onto the a reaction gas introduced to cause a plasma. A discharge tube 12 is also provided on the side wall of the reaction chamber 1 for discharging the used gas from the reaction chamber 1. A dielectric film is provided on the top of the reaction chamber 1 which is made of a microwave-permissible dielectric such as quartz glass or $Al_2O_3$ having a small dielectric loss and a high heat resistivity. The sample holder 7 serves as a cathode to be supplied with the high frequency power from the high frequency power supply 9.

On the top surface of the dielectric film 2, an opposite electrode 11 serving as an anode and being made of aluminum-based material is provided which has a plurality of windows 14 through which microwaves are transmitted into the reaction chamber 1. The opposite electrode 11 is thus provided outside the reaction chamber to be separated from the plasma. The opposite electrode 11 is made of an aluminum-based material and is coated with alumite. The opposite electrode 11 is also contacted with the side wall of the reaction chamber 1 and the side wall of the reaction chamber 1 is grounded by a ground line 10 so as to allow a strain free electric field to be generated between the electrodes and allow a uniform bias voltage on the sample S. A sheet type rubber heater 16 is also provided on the bottom of the opposite end portions of the opposite electrode 11 for heating up the opposite electrode 11 for preventing deposition from adhesion on the opposite electrode 11. The sheet type rubber heater 16 is also connected to the heater power supply 19. A dielectric line 3 is provided which extends to cover the dielectric film 2 and to be spaced apart from the dielectric film 2. The dielectric line 3 comprises a dielectric layer made of a dielectric having a small dielectric loss such as fluorine resin. An air blower not illustrated is provided over the dielectric plate 2 at a position lateral to the opposite electrode 11 for blowing a temperature-controlled air to the opposite electrode 11 and the top surface of the dielectric film 2 preferably in a lateral direction but vertical to a direction of propagation of the microwave so that the dielectric plate 2 underlying the opposite electrode 11 is almost uniformly heated whereby no remarkable variation in temperature appears in the dielectric film 2. A metal plate 4 made of a metal such as aluminum is provided which laminates on the top of the dielectric line 3. The metal plate 4 extends not only over the top surface of the dielectric line 3 but also on the end of the dielectric line 3 for sealing the end of the dielectric line 3. A waveguide 6 is provided which is connected with the dielectric line 3 for guiding the transmission or propagation of the microwave. A microwave oscillator 5 is provided which is connected to the waveguide 6 for generating the microwave which is to be transmitted or propagated through the waveguide 6 and the dielectric line 3 and also through the microwave-permissible dielectric plate 2 and the windows 14 into the inner space of the reaction chamber 1 so that the microwave is irradiated onto the reaction gas introduced to cause the plasma which is to be irradiated onto the sample for plasma treatment.

The above plasma treatment system is operated as follows. The used gas us discharged through the discharge tube 12 to reduce the pressure of the gas in the reaction chamber 1 at a predetermined value. Thereafter, the fresh reaction gas is introduced through the gas supply tube 13 into the reaction chamber 1. A microwave is generated by the microwave generator 5. The generated microwave is then introduced through the waveguide 6 into the dielectric line 3 whereby an electric field is generated in the space positioned under the dielectric line 3. The generated electric field is transmitted through the microwave-permissible dielectric plate 2 and the windows 14 of the opposite electrode 18 into the inner space of the reaction chamber 1. Since the reaction gas has been introduced into the inner space, the electric field or the microwave is applied to the reaction gas whereby a plasma is caused. On the other hand, the high frequency voltage is applied to the sample holder 7 holding the sample S for causing a bias voltage on the surface of the sample S so that the bias voltage controls energy of ions in the plasma generated. The bias voltage causes the ions of the plasma to be irradiated onto the top surface of the sample S in the right angle to the top surface of the sample S for plasma treatment of the sample S.

Since the opposite electrode 11 is separated by the dielectric film 2 from the inner space of the reaction chamber 1, the opposite electrode 11 made of aluminum-based material is not exposed to the plasma generated in the inner space of the reaction chamber 1. No exposure of the opposite electrode made of the aluminum-based material causes no clack on the alumite coating layer on the opposite electrode whereby no reaction of aluminum of the opposite electrode with fluorine in the reaction gas is caused to form no dust particles $AlF_3$.

Further, the air blower not illustrated is provided over the dielectric plate 2 at the position lateral to the opposite electrode 11 for blowing the temperature-controlled air to the opposite electrode 11 and the top surface of the dielectric film 2 preferably in a lateral direction but vertical to a direction of propagation of the microwave so that the dielectric plate 2 underlying the opposite electrode 11 is almost uniformly heated whereby no remarkable variation in temperature appears in the dielectric film 2. In place of the temperature controlled air, atmospheric temperature air may be used.

Fourth Embodiment:

A fourth embodiment according to the present invention will be described in detail with reference to FIG. 3 which is a cross sectional elevation view illustrative of a novel plasma treatment system which is capable of preventing generation of dust particles and of keeping a dielectric film provided in the system at a constant temperature without variation in temperature of a center portion of the dielectric film.

The novel plasma treatment system has a reaction chamber 1 which is rectangular-shaped and made of a metal such as aluminum and stainless steel. In the reaction chamber 1, a sample stage 8 is provided which has a sample holder 7 which holds a sample to be treated with plasma. A high frequency power 9 is provided which is electrically connected to the sample holder 7 for applying a high frequency voltage to the sample S. The sample stage 8 is provided on a bottom wall of the reaction chamber 1. Side walls of the reaction chamber 1 are formed thickly so that electrical heaters 15 are provided within the side walls of the reaction chamber 1. The heaters 15 are electrically connected to a heater power 19 for supplying a power to the heaters 15 so that the heaters 15 heat up inner space of the reaction chamber 1. A gas supply tube 13 is provided on a side wall of the reaction chamber 1 for supplying a reaction gas into the reaction chamber 1 so that the microwave is irradiated onto the a reaction gas introduced to cause a plasma. A discharge tube 12 is also provided on the side wall of the reaction chamber 1 for discharging the used gas from the reaction chamber 1. A dielectric film is provided on the top of the reaction chamber 1 which is made of a microwave-permissible dielectric such as quartz glass or $Al_2O_3$ having a small dielectric loss and a high heat resistivity. The sample holder 7 serves as a cathode to be supplied with the high frequency power from the high frequency power supply 9.

On the top surface of the dielectric film 2, an opposite electrode 11 serving as an anode and being made of aluminum-based material is provided which has a plurality of windows 14 through which microwaves are transmitted into the reaction chamber 1. The opposite electrode 11 is thus provided outside the reaction chamber to be separated from the plasma. The opposite electrode 11 is made of an aluminum-based material and is coated with alumite. The opposite electrode 11 is also contacted with the side wall of the reaction chamber 1 and the side wall of the reaction chamber 1 is grounded by a ground line 10 so as to allow a strain free electric field to be generated between the electrodes and allow a uniform bias voltage on the sample S. A sheet type rubber heater 16 is also provided on the bottom of the opposite end portions of the opposite electrode 11 for heating up the opposite electrode 11 for preventing deposition from adhesion on the opposite electrode 11. The sheet type rubber heater 16 is also connected to the heater power supply 19. A dielectric line 3 is provided which extends to cover the dielectric film 2 and to be spaced apart from the dielectric film 2. The dielectric line 3 comprises a dielectric layer made of a dielectric having a small dielectric loss such as fluorine resin. A liquid-type temperature controller not illustrated is provided over the dielectric plate 2 and under the opposite electrode 11 for flowing a temperature-controlled liquid in the liquid-type temperature controller extending over the dielectric plate 2 and under the opposite electrode 11 so that the dielectric plate 2 underlying the liquid-type temperature controller is almost uniformly heated whereby no remarkable variation in temperature appears in the dielectric film 2. A metal plate 4 made of a metal such as aluminum is provided which laminates on the top of the dielectric line 3. The metal plate 4 extends not only over the top surface of the dielectric line 3 but also on the end of the dielectric line 3 for sealing the end of the dielectric line 3. A waveguide 6 is provided which is connected with the dielectric line 3 for guiding the transmission or propagation of the microwave. A microwave oscillator 5 is provided which is connected to the waveguide 6 for generating the microwave which is to be transmitted or propagated through the waveguide 6 and the dielectric line 3 and also through the microwave-permissible dielectric plate 2 and the windows 14 into the inner space of the reaction chamber 1 so that the microwave is irradiated onto the reaction gas introduced to cause the plasma which is to be irradiated onto the sample for plasma treatment.

The above plasma treatment system is operated as follows. The used gas us discharged through the discharge tube 12 to reduce the pressure of the gas in the reaction chamber 1 at a predetermined value. Thereafter, the fresh reaction gas is introduced through the gas supply tube 13 into the reaction chamber 1. A microwave is generated by the microwave generator 5. The generated microwave is then introduced through the waveguide 6 into the dielectric line 3 whereby an electric field is generated in the space positioned under the dielectric line 3. The generated electric field is transmitted through the microwave-permissible dielectric plate 2 and the windows 14 of the opposite electrode 18 into the inner space of the reaction chamber 1. Since the reaction gas has been introduced into the inner space, the electric field or the microwave is applied to the reaction gas whereby a plasma is caused. On the other hand, the high frequency voltage is applied to the sample holder 7 holding the sample S for causing a bias voltage on the surface of the sample S so that the bias voltage controls energy of ions in the plasma generated. The bias voltage causes the ions of the plasma to be irradiated onto the top surface of the sample S in the right angle to the top surface of the sample S for plasma treatment of the sample S.

Since the opposite electrode 11 is separated by the dielectric film 2 from the inner space of the reaction chamber 1, the opposite electrode 11 made of aluminum-based material is not exposed to the plasma generated in the inner space of the reaction chamber 1. No exposure of the opposite electrode made of the aluminum-based material causes no clack on the alumite coating layer on the opposite electrode whereby no reaction of aluminum of the opposite electrode with fluorine in the reaction gas is caused to form no dust particles $AlF_3$.

Further, the liquid-type temperature controller not illustrated is provided over the dielectric plate 2 and under the opposite electrode 11 for flowing a temperature-controlled liquid in the liquid-type temperature controller extending over the dielectric plate 2 and under the opposite electrode 11 so that the dielectric plate 2 underlying the liquid-type temperature controller is almost uniformly heated whereby no remarkable variation in temperature appears in the dielectric film 2.

Fifth Embodiment:

A fifth embodiment according to the present invention will be described in detail with reference to FIG. 4 which is a cross sectional elevation view illustrative of a novel plasma treatment system which is capable of preventing generation of dust particles and of keeping a dielectric film provided in the system at a constant temperature without variation in temperature of a center portion of the dielectric film.

The novel plasma treatment system has a reaction chamber 1 which is rectangular-shaped and made of a metal such as aluminum and stainless steel. In the reaction chamber 1, a sample stage 8 is provided which has a sample holder 7 which holds a sample to be treated with plasma. A high frequency power 9 is provided which is electrically connected to the sample holder 7 for applying a high frequency voltage to the sample S. The sample stage 8 is provided on a bottom wall of the reaction chamber 1. Side walls of the reaction chamber 1 are formed thickly so that electrical heaters 15 are provided within the side walls of the reaction chamber 1. The heaters 15 are electrically connected to a heater power 19 for supplying a power to the heaters 15 so that the heaters 15 heat up inner space of the reaction chamber 1. A gas supply tube 13 is provided on a side wall of the reaction chamber 1 for supplying a reaction gas into the reaction chamber 1 so that the microwave is irradiated onto the a reaction gas introduced to cause a plasma. A discharge tube 12 is also provided on the side wall of the reaction chamber 1 for discharging the used gas from the reaction chamber 1. A dielectric film is provided on the top of the reaction chamber 1 which is made of a microwave-permissible dielectric such as quartz glass or $Al_2O_3$ having a small dielectric loss and a high heat resistivity. The sample holder 7 serves as a cathode to be supplied with the high frequency power from the high frequency power supply 9.

On the top surface of the dielectric film 2, an opposite electrode 18 serving as an anode and being made of aluminum-based material is provided which has a plurality of windows 14 through which microwaves are transmitted into the reaction chamber 1. FIG. 5A is a plane view illustrative of an opposite electrode 18 having windows 14 and additional heaters 17 provided in the plasma treatment system. FIG. 5B is a fragmentary cross sectional elevation view illustrative of an opposite electrode 18 having windows 14 and additional heaters 17 provided in the plasma treatment system. The opposite electrode 18 is thus provided outside the reaction chamber to be separated from the plasma. The opposite electrode 18 is made of an aluminum-based material and is coated with alumite. The opposite electrode 18 is also contacted with the side wall of the reaction chamber 1 and the side wall of the reaction chamber 1 is grounded by a ground line 10 so as to allow a strain free electric field to be generated between the electrodes and allow a uniform bias voltage on the sample S. A sheet type rubber heater 16 is also provided on the bottom of the opposite end portions of the opposite electrode 18 for heating tip the opposite electrode 18 for preventing deposition from adhesion on the opposite electrode 18. The sheet type rubber heater 16 is also connected to the heater power supply 19. A dielectric line 3 is provided which extends to cover the dielectric film 2 and to be spaced apart from the dielectric film 2. The dielectric line 3 comprises a dielectric layer made of a dielectric having a small dielectric loss such as fluorine resin. The additional heaters 17 are stripe-shaped and extend within the opposite electrode 18 in parallel to the stripe-shaped windows 14. Since the additional heaters 17 are distributed entirely over the center portion of the opposite electrode 18 and the sheet type rubber heater 16 extends on the peripheral portion of the opposite electrode 18 so that the dielectric plate 2 underlying the opposite electrode 18 is almost uniformly heated whereby no remarkable variation in temperature appears in the dielectric film 2. Further, an air blower not illustrated is provided over the dielectric plate 2 at the position lateral to the opposite electrode 11 for blowing the temperature-controlled air to the opposite electrode 11 and the top surface of the dielectric film 2 preferably in a lateral direction but vertical to a direction of propagation of the microwave so that the dielectric plate 2 underlying the opposite electrode 11 is almost uniformly heated whereby no remarkable variation in temperature appears in the dielectric film 2. In place of the temperature controlled air, atmospheric temperature air may be used.

A metal plate 4 made of a metal such as aluminum is provided which laminates on the top of the dielectric line 3. The metal plate 4 extends not only over the top surface of the dielectric line 3 but also on the end of the dielectric line 3 for sealing the end of the dielectric line 3. A waveguide 6 is provided which is connected with the dielectric line 3 for guiding the transmission or propagation of the microwave. A microwave oscillator 5 is provided which is connected to the waveguide 6 for generating the microwave which is to be transmitted or propagated through the waveguide 6 and the dielectric line 3 and also through the microwave-permissible dielectric plate 2 and the windows 14 into the inner space of the reaction chamber 1 so that the microwave is irradiated onto the reaction gas introduced to cause the plasma which is to be irradiated onto the sample for plasma treatment.

The above plasma treatment system is operated as follows. The used gas us discharged through the discharge tube 12 to reduce the pressure of the gas in the reaction chamber 1 at a predetermined value. Thereafter, the fresh reaction gas is introduced through the gas supply tube 13 into the reaction chamber 1. A microwave is generated by the microwave generator 5. The generated microwave is then introduced through the waveguide 6 into the dielectric line 3 whereby an electric field is generated in the space positioned under the dielectric line 3. The generated electric field is transmitted through the microwave-permissible dielectric plate 2 and the windows 14 of the opposite electrode 18 into the inner space of the reaction chamber 1. Since the reaction gas has been introduced into the inner space, the electric field or the microwave is applied to the reaction gas whereby a plasma is caused. On the other hand, the high frequency voltage is applied to the sample holder 7 holding the sample S for causing a bias voltage on the surface of the sample S so that the bias voltage controls energy of ions in the plasma generated. The bias voltage causes the ions of the plasma to be irradiated onto the top surface of the sample S in the right angle to the top surface of the sample S for plasma treatment of the sample S.

Since the opposite electrode 18 is separated by the dielectric film 2 from the inner space of the reaction chamber 1, the opposite electrode 11 made of aluminum-based material is not exposed to the plasma generated in the inner space of the reaction chamber 1. No exposure of the opposite electrode made of the aluminum-based material causes no clack on the alumite coating layer on the opposite electrode whereby no reaction of aluminum of the opposite electrode with fluorine in the reaction gas is caused to form no dust particles $AlF_3$.

Further, the additional heaters 17 are distributed entirely over the center portion of the opposite electrode 18 and the sheet type rubber heater 16 extends on the peripheral portion of the opposite electrode 18 so that the dielectric plate 2 underlying the opposite electrode 18 is almost uniformly heated whereby no remarkable variation in temperature appears in the dielectric film 2. Further more the air blower not illustrated is provided over the dielectric plate 2 at the position lateral to the opposite electrode 11 for blowing the temperature-controlled air to the opposite electrode 11 and the top surface of the dielectric film 2 preferably in a lateral direction but vertical to a direction of propagation of the microwave so that the dielectric plate 2 underlying the opposite electrode 11 is almost uniformly heated whereby no remarkable variation in temperature appears in the dielectric film 2. In place of the temperature controlled air, atmospheric temperature air may be used.

Sixth Embodiment:

A sixth embodiment according to the present invention will be described in detail with reference to FIG. 4 which is a cross sectional elevation view illustrative of a novel plasma treatment system which is capable of preventing generation of dust particles and of keeping a dielectric film provided in the system at a constant temperature without variation in temperature of a center portion of the dielectric film.

The novel plasma treatment system has a reaction chamber 1 which is rectangular-shaped and made of a metal such as aluminum and stainless steel. In the reaction chamber 1, a sample stage 8 is provided which has a sample holder 7 which holds a sample to be treated with plasma. A high frequency power 9 is provided which is electrically connected to the sample holder 7 for applying a high frequency voltage to the sample S. The sample stage 8 is provided on a bottom wall of the reaction chamber 1. Side walls of the reaction chamber 1 are formed thickly so that electrical heaters 15 are provided within the side walls of the reaction chamber 1. The heaters 15 are electrically connected to a heater power 19 for supplying a power to the heaters 15 so that the heaters 15 heat up inner space of the reaction chamber 1. A gas supply tube 13 is provided on a side wall of the reaction chamber 1 for supplying a reaction gas into the reaction chamber 1 so that the microwave is irradiated onto the a reaction gas introduced to cause a plasma. A discharge tube 12 is also provided on the side wall of the reaction chamber 1 for discharging the used gas from the reaction chamber 1. A dielectric film is provided on the top of the reaction chamber 1 which is made of a microwave-permissible dielectric such as quartz glass or $Al_2O_3$ having a small dielectric loss and a high heat resistivity. The sample holder 7 serves as a cathode to be supplied with the high frequency power from the high frequency power supply 9.

On the top surface of the dielectric film 2, an opposite electrode 18 serving as an anode and being made of aluminum-based material is provided which has a plurality of windows 14 through which microwaves are transmitted into the reaction chamber 1. FIG. 5A is a plane view illustrative of an opposite electrode 18 having windows 14 and additional heaters 17 provided in the plasma treatment system. FIG. 5B is a fragmentary cross sectional elevation view illustrative of an opposite electrode 18 having windows 14 and additional heaters 17 provided in the plasma treatment system. The opposite electrode 18 is thus provided outside the reaction chamber to be separated from the plasma. The opposite electrode 18 is made of an aluminum-based material and is coated with alumite. The opposite electrode 18 is also contacted with the side wall of the reaction chamber 1 and the side wall of the reaction chamber 1 is grounded by a ground line 10 so as to allow a strain free electric field to be generated between the electrodes and allow a uniform bias voltage on the sample S. A sheet type rubber heater 16 is also provided on the bottom of the opposite end portions of the opposite electrode 18 for heating up the opposite electrode 18 for preventing deposition from adhesion on the opposite electrode 18. The sheet type rubber heater 16 is also connected to the heater power supply 19. A dielectric line 3 is provided which extends to cover the dielectric film 2 and to be spaced apart from the dielectric film 2. The dielectric line 3 comprises a dielectric layer made of a dielectric having a small dielectric loss such as fluorine resin. The additional heaters 17 are stripe-shaped and extend within the opposite electrode 11 in parallel to the stripe-shaped windows 14. Since the additional heaters 17 are distributed entirely over the center portion of the opposite electrode 18 and the sheet type rubber heater 16 extends on the peripheral portion of the opposite electrode 18 so that the dielectric plate 2 underlying the opposite electrode 18 is almost uniformly heated whereby no remarkable variation in temperature appears in the dielectric film 2. Further, a liquid-type temperature controller not illustrated is provided over the dielectric plate 2 and under the opposite electrode 11 for flowing a temperature-controlled liquid in the liquid-type temperature controller extending over the dielectric plate 2 and under the opposite electrode 11 so that the dielectric plate 2 underlying the liquid-type temperature controller is almost uniformly heated whereby no remarkable variation in temperature appears in the dielectric film 2.

A metal plate 4 made of a metal such as aluminum is provided which laminates on the top of the dielectric line 3. The metal plate 4 extends not only over the top surface of the dielectric line 3 but also on the end of the dielectric line 3 for sealing the end of the dielectric line 3. A waveguide 6 is provided which is connected with the dielectric line 3 for guiding the transmission or propagation of the microwave. A microwave oscillator 5 is provided which is connected to the waveguide 6 for generating the microwave which is to be transmitted or propagated through the waveguide 6 and the dielectric line 3 and also through the microwave-permissible dielectric plate 2 and the windows 14 into the inner space of the reaction chamber 1 so that the microwave is irradiated onto the reaction gas introduced to cause the plasma which is to be irradiated onto the sample for plasma treatment.

The above plasma treatment system is operated as follows. The used gas us discharged through the discharge tube 12 to reduce the pressure of the gas in the reaction chamber 1 at a predetermined value. Thereafter, the fresh reaction gas is introduced through the gas supply tube 13 into the reaction chamber 1. A microwave is generated by the microwave generator 5. The generated microwave is then introduced through the waveguide 6 into the dielectric line 3 whereby an electric field is generated in the space positioned under the dielectric line 3. The generated electric field is transmitted through the microwave-permissible dielectric plate 2 and the windows 14 of the opposite electrode 18 into the inner space of the reaction chamber 1. Since the reaction gas has been introduced into the inner space, the electric field or the microwave is applied to the reaction gas whereby a plasma is caused. On the other hand, the high frequency voltage is applied to the sample holder 7 holding the sample S for causing a bias voltage on the surface of the sample S so that the bias voltage controls energy of ions in the plasma generated. The bias voltage causes the ions of the plasma to be irradiated onto the top surface of the sample S in the right angle to the top surface of the sample S for plasma treatment of the sample S.

Since the opposite electrode 18 is separated by the dielectric film 2 from the inner space of the reaction chamber 1, the opposite electrode 11 made of aluminum-based material is not exposed to the plasma generated in the inner space of the reaction chamber 1. No exposure of the opposite electrode made of the aluminum-based material causes no clack on the alumite coating layer on the opposite electrode whereby no reaction of aluminum of the opposite electrode with fluorine in the reaction gas is caused to form no dust particles $AlF_3$.

Further, the additional heaters 17 are distributed entirely over the center portion of the opposite electrode 18 and the sheet type rubber heater 16 extends on the peripheral portion of the opposite electrode 18 so that the dielectric plate 2 underlying the opposite electrode 18 is almost uniformly heated whereby no remarkable variation in temperature appears in the dielectric film 2. Further more the liquid-type temperature controller not illustrated is provided over the dielectric plate 2 and under the opposite electrode 11 for flowing a temperature-controlled liquid in the liquid-type temperature controller extending over the dielectric plate 2 and under the opposite electrode 11 so that the dielectric plate 2 underlying the liquid-type temperature controller is almost uniformly heated whereby no remarkable variation in temperature appears in the dielectric film 2.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. An opposite electrode structure provided in a plasma treatment system having a reaction chamber in which a plasma is generated to be irradiated onto a sample held on a sample holder in said reaction chamber, said reaction chamber having a top covered by a dielectric plate, said opposite electrode structure comprising an opposite electrode having a plurality of windows through which microwave is transmitted into said reaction chamber for causing said plasma, wherein said opposite electrode is provided over a top surface of said dielectric plate so that said opposite electrode is separated by said dielectric plate from said plasma generated in said reaction chamber.

2. The opposite electrode structure as claimed in claim 1, further comprising at least an internal heater provided within said opposite electrode.

3. The opposite electrode structure as claimed in claim 2, wherein said internal heater is provided to be entirely distributed over said opposite electrode.

4. The opposite electrode structure as claimed in claim 1, further comprising at least an internal heater provided within a center region of said opposite electrode and a peripheral heater provided on a peripheral region of said opposite electrode.

5. The opposite electrode structure as claimed in claim 1, further comprising an air-type temperature controller provided over said dielectric plate for blowing a temperature-controlled air to said opposite electrode and the top surface of said dielectric plate for controlling a temperature of said dielectric plate.

6. The opposite electrode structure as claimed in claim 1, further comprising a liquid-type temperature controller provided over said dielectric plate and under said opposite electrode for flowing a temperature-controlled liquid in said liquid-type temperature controller for controlling a temperature of said dielectric plate.

7. The opposite electrode structure as claimed in claim 1, further comprising:
  an air-type temperature controller provided over said dielectric plate for blowing a temperature-controlled air to said opposite electrode and the top surface of said dielectric plate for controlling a temperature of said dielectric plate; and
  at least an internal heater provided within said opposite electrode.

8. The opposite electrode structure as claimed in claim 1, further comprising:
  a liquid-type temperature controller provided over said dielectric plate and under said opposite electrode for flowing a temperature-controlled liquid in said liquid-type temperature controller for controlling a temperature of said dielectric plate; and
  at least an internal heater provided within said opposite electrode.

9. A plasma treatment system having a reaction chamber in which a plasma is generated to be irradiated onto a sample held on a sample holder in said reaction chamber, said reaction chamber having a top covered by a dielectric plate, said plasma treatment system also having an opposite electrode having a plurality of windows through which microwave is transmitted into said reaction chamber for causing said plasma, wherein said opposite electrode is provided over a top surface of said dielectric plate so that said opposite electrode is separated by said dielectric plate from said plasma generated in said reaction chamber.

10. The plasma treatment system as claimed in claim 9, further comprising at least an internal heater provided within said opposite electrode.

11. The plasma treatment system as claimed in claim 10, wherein said internal heater is provided to be entirely distributed over said opposite electrode.

12. The plasma treatment system as claimed in claim 9, further comprising at least an internal heater provided within a center region of said opposite electrode and a peripheral heater provided on a peripheral region of said opposite electrode.

13. The plasma treatment system as claimed in claim 9, further comprising an air-type temperature controller provided over said dielectric plate for blowing a temperature-controlled air to said opposite electrode and the top surface of said dielectric plate for controlling a temperature of said dielectric plate.

14. The plasma treatment system as claimed in claim 9, further comprising a liquid-type temperature controller provided over said dielectric plate and under said opposite electrode for flowing a temperature-controlled liquid in said liquid-type temperature controller for controlling a temperature of said dielectric plate.

15. The plasma treatment system as claimed in claim 9, further comprising:
  an air-type temperature controller provided over said dielectric plate for blowing a temperature-controlled air to said opposite electrode and the top surface of said dielectric plate for controlling a temperature of said dielectric plate; and
  at least an internal heater provided within said opposite electrode.

16. The plasma treatment system as claimed in claim 9, further comprising:
  a liquid-type temperature controller provided over said dielectric plate and under said opposite electrode for flowing a temperature-controlled liquid in said liquid-type temperature controller for controlling a temperature of said dielectric plate; and
  at least an internal heater provided within said opposite electrode.

* * * * *